(12) United States Patent
Jang

(10) Patent No.: US 10,714,401 B2
(45) Date of Patent: Jul. 14, 2020

(54) PRINTED CIRCUIT BOARD AND SEMICONDUCTOR PACKAGE INCLUDING THE SAME

(71) Applicant: Samsung Electronics Co., Ltd., Suwon-si, Gyeonggi-do (KR)

(72) Inventor: Keun-ho Jang, Asan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/238,088

(22) Filed: Jan. 2, 2019

(65) Prior Publication Data

US 2020/0051879 A1    Feb. 13, 2020

(30) Foreign Application Priority Data

Aug. 13, 2018   (KR) .................. 10-2018-0094626

(51) Int. Cl.
| | | |
|---|---|---|
| *H01L 23/02* | (2006.01) | |
| *H01L 23/13* | (2006.01) | |
| *H01L 21/56* | (2006.01) | |
| *H01L 23/00* | (2006.01) | |
| *H01L 23/538* | (2006.01) | |

(52) U.S. Cl.
CPC ............ *H01L 23/13* (2013.01); *H01L 21/565* (2013.01); *H01L 23/5384* (2013.01); *H01L 23/5386* (2013.01); *H01L 24/16* (2013.01); *H01L 2224/16227* (2013.01); *H01L 2924/15331* (2013.01)

(58) Field of Classification Search
USPC ......................................................... 257/678
See application file for complete search history.

(56) References Cited

U.S. PATENT DOCUMENTS

| | | | |
|---|---|---|---|
| 5,936,309 A | 8/1999 | Kim | |
| 7,566,960 B1* | 7/2009 | Conn | .................... H01L 23/055 257/678 |
| 8,409,918 B2* | 4/2013 | Yang | ........................ H01L 24/97 257/678 |
| 2002/0095192 A1* | 7/2002 | Pu | ......................... H01L 21/563 607/36 |
| 2012/0139109 A1 | 6/2012 | Choi | |
| 2013/0161800 A1 | 6/2013 | Byun et al. | |
| 2015/0321417 A1 | 11/2015 | Mironets | |
| 2016/0013126 A1 | 1/2016 | Kim et al. | |

(Continued)

FOREIGN PATENT DOCUMENTS

| | | |
|---|---|---|
| KR | 10-1999-0033204 U | 8/1999 |
| KR | 10-2012-0062457 A | 6/2012 |

(Continued)

*Primary Examiner* — Niki H Nguyen
(74) *Attorney, Agent, or Firm* — Harness, Dickey & Pierce, P.L.C.

(57) ABSTRACT

A semiconductor package including a package substrate including a mounting region and at least one through-hole arranged in the mounting region, and a semiconductor chip mounted on the mounting region, the semiconductor chip including a first side and a second side, the second side of the semiconductor chip being opposite to the first side of the semiconductor chip, the at least one through-hole of the package substrate being closer to the second side of the semiconductor chip than the first side of the semiconductor chip may be provided.

19 Claims, 16 Drawing Sheets

(56) References Cited

U.S. PATENT DOCUMENTS

2016/0351482 A1* 12/2016 Zhang ................ H01L 21/561
2018/0076105 A1    3/2018 Ki et al.

FOREIGN PATENT DOCUMENTS

| KR | 10-2013-0071792 A | 7/2013 |
| KR | 10-2016-0008051 A | 1/2016 |
| KR | 10-2018-0029492 A | 3/2018 |

* cited by examiner

IC − IC'

ID − ID'

IIC – IIC'

IID – IID'

IIE − IIE'

US 10,714,401 B2

PRINTED CIRCUIT BOARD AND SEMICONDUCTOR PACKAGE INCLUDING THE SAME

CROSS-REFERENCE TO RELATED APPLICATION

This application claims the benefit of Korean Patent Application No. 10-2018-0094626, filed on Aug. 13, 2018 in the Korean Intellectual Property Office, the disclosure of which is incorporated herein in its entirety by reference.

BACKGROUND

The inventive concepts relate to printed circuit boards and/or semiconductor packages including the same, and more particularly, to printed circuit boards for mounting a semiconductor chip and/or to semiconductor packages including the printed circuit board on which the semiconductor chip is mounted.

In general, a semiconductor package is manufactured by mounting a semiconductor chip on a package substrate, electrically connecting a certain circuit pattern formed on the package substrate to the semiconductor chip, and then molding the semiconductor chip with a mold material. When a semiconductor package has a flip chip structure in which a semiconductor chip and a package substrate are connected to each other by using bumps arranged therebetween, an underfill process is performed to fill a space between the semiconductor chip and the package substrate with a mold material.

SUMMARY

The inventive concepts provide a printed circuit boards and/or semiconductor packages including the same.

According to an example embodiment of the inventive concepts, a semiconductor package includes a package substrate including a mounting region and at least one through-hole arranged in the mounting region, and a semiconductor chip mounted on the mounting region, the semiconductor chip including a first side and a second side, the second side of the semiconductor chip being opposite to the first side of the semiconductor chip, the second side of the semiconductor chip being closer to the at least one through-hole of the package substrate than the first side of the semiconductor chip.

According to an example embodiment of the inventive concepts, a semiconductor package includes a package substrate, a semiconductor chip mounted on the package substrate, the semiconductor chip including a first side and a second side opposite to the first side, and a molding layer including an underfill part between the semiconductor chip and a first surface of the package substrate, and at least one extension part penetrating the package substrate, the extension part being between the first side of the semiconductor chip and the second side of the semiconductor chip, the extension part being closer to the second side of the semiconductor chip than the first side of the semiconductor chip.

According to an example embodiment of the inventive concepts, a printed circuit board for a molded underfill process, in which a mold material is injected in one direction, includes a substrate base including a first side and a second side opposite to the first side, the first side of the substrate base being a side into which a mold material is injected, and at least one through-hole penetrating the substrate base, the at least one through-hole configured to receive the mold material therethrough, the at least one through-hole being closer to the second side of the substrate base than to the first side of the substrate base.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
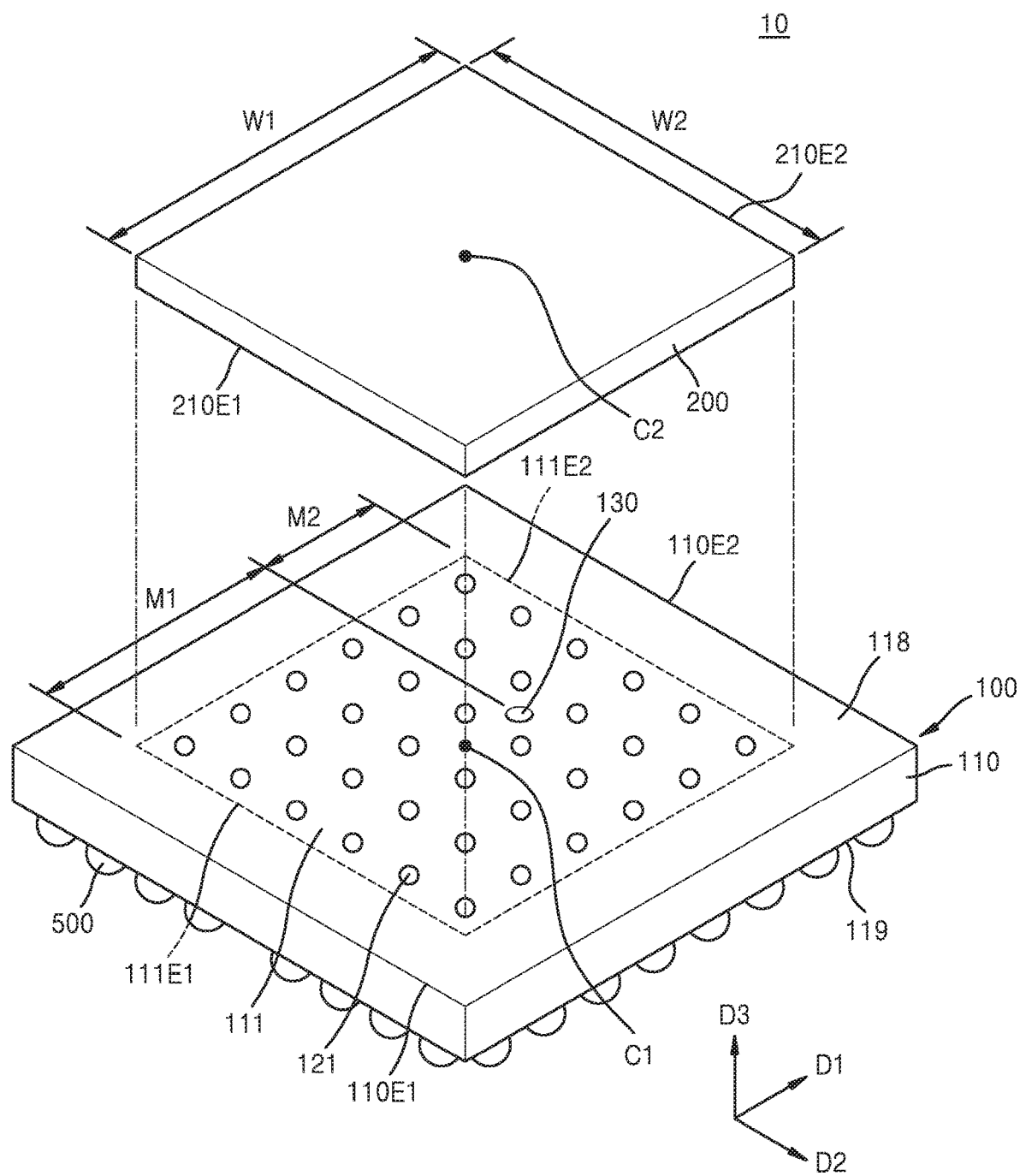
FIGS. 1A through 1D are drawings for explaining a semiconductor package according to an example embodiment.

Hereinafter, some example embodiments of the inventive concepts are described in detail with reference to the accompanying drawings. Identical reference numerals are used for the same constituent elements in the drawings, and a duplicate description thereof are omitted.

While the term "same" is used in description of example embodiments, it should be understood that some imprecisions may exist. Thus, when one element is referred to as being the same as another element, it should be understood that the one element is the same as another element within a desired manufacturing tolerance range (e.g., ±10%).

When the terms "about" or "substantially" are used in this specification in connection with a numerical value, it is intended that the associated numerical value include a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Figure 1B:
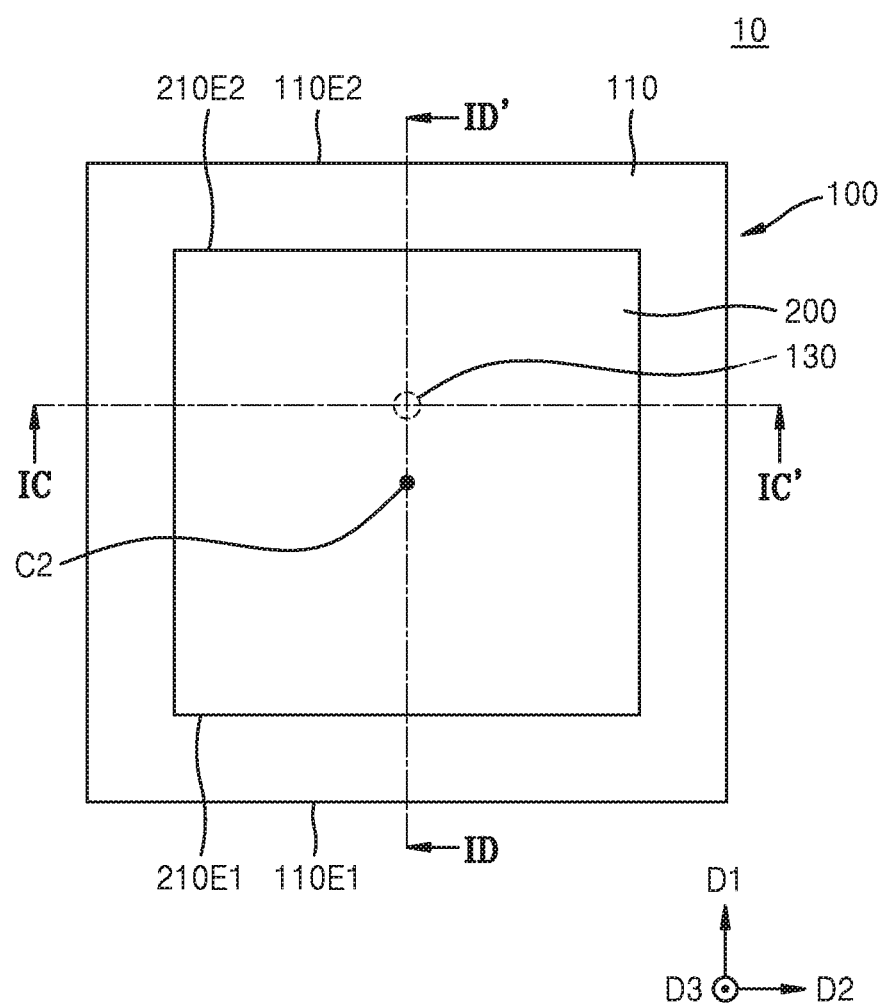
Figure 1C:
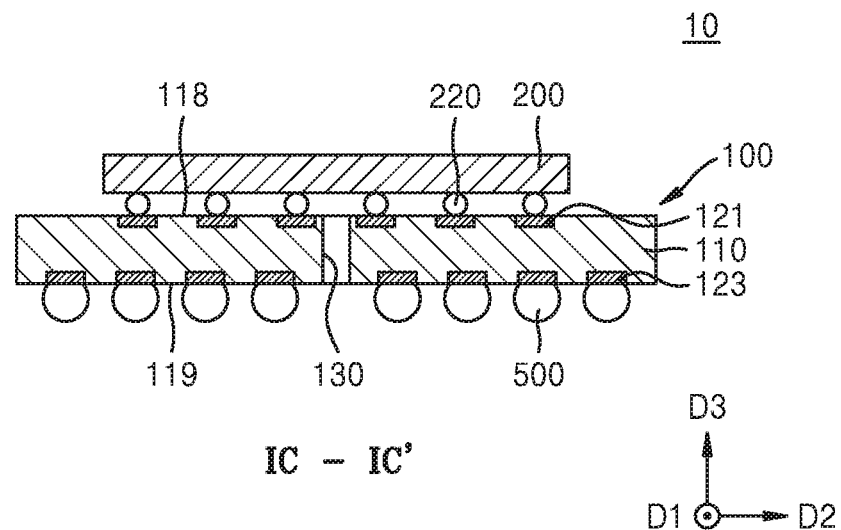
Figure 1D:
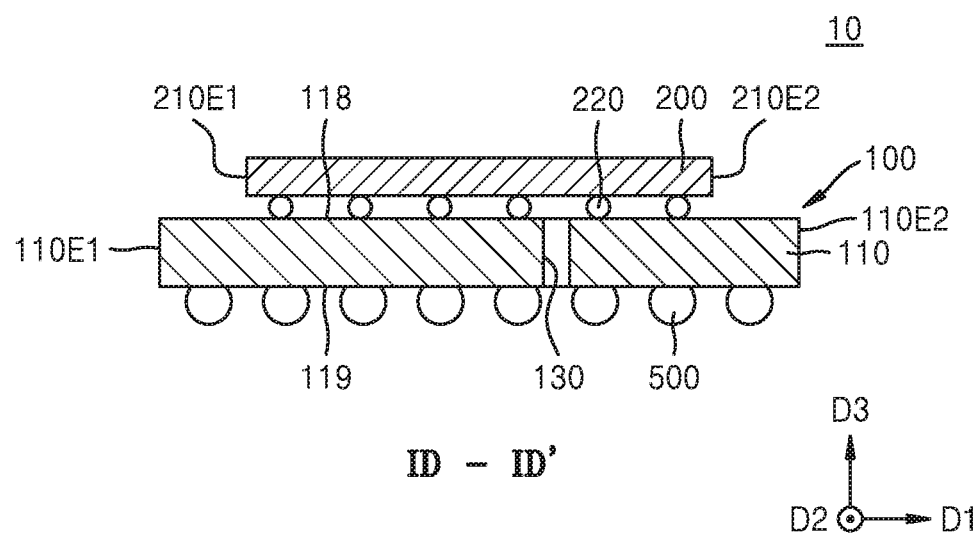

FIGS. 1A through 1D are drawings for explaining a semiconductor package 10 according to an example embodiment. FIG. 1A is an exploded perspective view of the semiconductor package 10, FIG. 1B is a plan view of the semiconductor package 10, FIG. 1C is a cross-sectional view of the semiconductor package 10 taken along a line IC-IC' in FIG. 1B, and FIG. 1D is a cross-sectional view of the semiconductor package 10 taken along a line ID-ID' in FIG. 1B.

Referring to FIGS. 1A through 1D, the semiconductor package 10 may include a package substrate 100 and a semiconductor chip 200.

The package substrate 100 may include, for example, a printed circuit board (PCB). The package substrate 100 may include a substrate base 110, a top connection pad 121 in a first surface (or a top surface) 118 of the substrate base 110, and a bottom connection pad 123 in a second surface (or a bottom surface) 119 of the substrate base 110.

The substrate base 110 may form an overall appearance of the package substrate 100, and may include at least one material of phenol resin, epoxy resin, or polyimide. An internal interconnection structure for electrically connecting the top connection pad 121 to the bottom connection pad 123 may be provided in the substrate base 110. The top connection pad 121 may be connected to a conductive connection structure 220 on a bottom surface of the semiconductor chip 200, and the bottom connection pad 123 may be connected to an external connection terminal 500.

The substrate base 110 may include a mounting region 111 on which the semiconductor chip 200 is mounted. The mounting region 111 may be an area where the semiconductor chip 200 is mounted. The mounting region 111 and the semiconductor chip 200 may substantially overlap each other in a vertical direction (e.g., a third direction D3). Because the mounting region 111 overlaps the semiconductor chip 200 in the vertical direction, the mounting region 111 may have the same or substantially similar shape and/or size as the semiconductor chip 200. Further, when a first direction D1 is defined as a direction perpendicular to a first side 210E1 of the semiconductor chip 200, and a second direction D2 is defined as a direction parallel to the first side 210E1 of the semiconductor chip 200, a center C1 of the mounting region 111 and a center C2 of the semiconductor chip 200 may coincide with each other on a plane parallel to the first direction D1 and the second direction D2. Further, a first width W1 of the semiconductor chip 200 in the first direction D1 may be substantially the same as or substantially similar to a width of the mounting region 111 in the first direction D1, and a second width W2 of the semiconductor chip 200 in the second direction D2 may be substantially equal to a width of the mounting region 111 in the second direction D2.

The semiconductor chip 200 may be mounted on the mounting region 111 of the package substrate 100. The semiconductor chip 200 may be mounted on the package substrate 100 in a flip-chip manner. For example, the semiconductor chip 200 may be connected to the top connection pad 121 of the package substrate 100 via a plurality of conductive connection structures 220 (e.g., bumps).

The semiconductor chip 200 may include, for example, a memory chip. The memory chip may include a volatile memory semiconductor chip such as dynamic random access memory (DRAM) and static RAM (SRAM), or a nonvolatile memory chip such as phase-change RAM (PRAM), magneto-resistive RAM (MRAM), ferroelectric RAM (FeRAM), and resistive RAM (RRAM). The semiconductor chip 200 may include, for example, a logic chip such as a central processing unit (CPU), a micro-processing unit (MPU), and an application processor (AP).

Although the semiconductor package 10 is illustrated as including one semiconductor chip in FIGS. 1A through 1D, the semiconductor package 10 may include a plurality of semiconductor chips. For example, the semiconductor chip 200 may be a chip stack in which a plurality of semiconductor chips are vertically stacked.

The package substrate 100 may include a through-hole 130 vertically penetrating the substrate base 110. The through-hole 130 may be arranged in the mounting region 111 of the package substrate 100, and may be apart by a certain distance from the center C1 of the mounting region 111 or the center C2 of the semiconductor chip 200 when viewed in a plan view.

For example, with respect to a center line that intersects the center C1 of the mounting region 111 in the second direction D2, the through-hole 130 may be apart by a certain distance from the center line in the first direction D1. In other words, the through-hole 130 may be arranged between a first side 111E1 of the mounting region 111 and a second side 111E2 of the mounting region 111 that is opposite to the first side 111E1 of the mounting region 111, and to be closer to the second side 111E2 of the mounting region 111 than the first side 111E of the mounting region 111. In other words, the through-hole 130 may be arranged between the first side 210E1 of the semiconductor chip 200 and the second side 210E2 of the semiconductor chip 200 opposite to the first side 210E1 of the semiconductor chip 200, and to be closer to the second side 210E2 of the semiconductor chip 200 than the first side 210E1 of the semiconductor chip 200.

In the example embodiment, a first distance M1 between the through-hole 130 and the first side 111E1 of the mounting region 111 in the first direction D1 may be greater than a second distance M2 between the through-hole 130 and the second side 111E2 of the mounting region 111 in the first direction D1. The first distance M1 may be about 1.2 to about 4 or about 1.5 to about 3 times the second distance M2. In some example embodiments, the first distance M1 may be about twice the second distance M2. The first distance M1 may be equal or substantially similar to a distance between the through-hole 130 and the first side 210E1 of the semiconductor chip 200 in the first direction D1, and the second distance M2 may be equal or substantially similar to a distance between the through-hole 130 and the second side 210E2 of the semiconductor chip 200 in the first direction D1.

Further, a center of the package substrate 100 may generally coincide with the center C1 of the mounting region 111 and/or the center C2 of the semiconductor chip 200, when projected or viewed in a plan view on the plane parallel to the first direction D1 and the second direction D2. In this case, when one side of the package substrate 100 close to the first side 210E1 of the semiconductor chip 200 may be referred to as a first side 110E1 of the package substrate 100, and another side opposite to the first side 110E1 of the package substrate 100 may be referred to as a second side 110E2 of the package substrate 100, the through-hole 130 may be closer to the second side 110E2 of the package substrate 100 than the first side 110E1 of the package substrate 100.

Although not illustrated in FIGS. 1A through 1D, an underfill material layer may be arranged between the package substrate 100 and the semiconductor chip 200. The underfill material layer may be filled between the package substrate 100 and the semiconductor chip 200, and may cover the plurality of conductive connection structures 220 between the package substrate 100 and the semiconductor chip 200.

For example, the underfill material layer filling between the package substrate 100 and the semiconductor chip 200 may be formed through an underfill process. Here, the through-hole 130 of the package substrate 100 may function as a vent hole for discharging air to prevent occurrence of a void defect between the package substrate 100 and the semiconductor chip 200 during the underfill process. A process of discharging air via the through-hole 130 in a molding process is described later with reference to FIGS. 3 through 8.

Figure 2A:
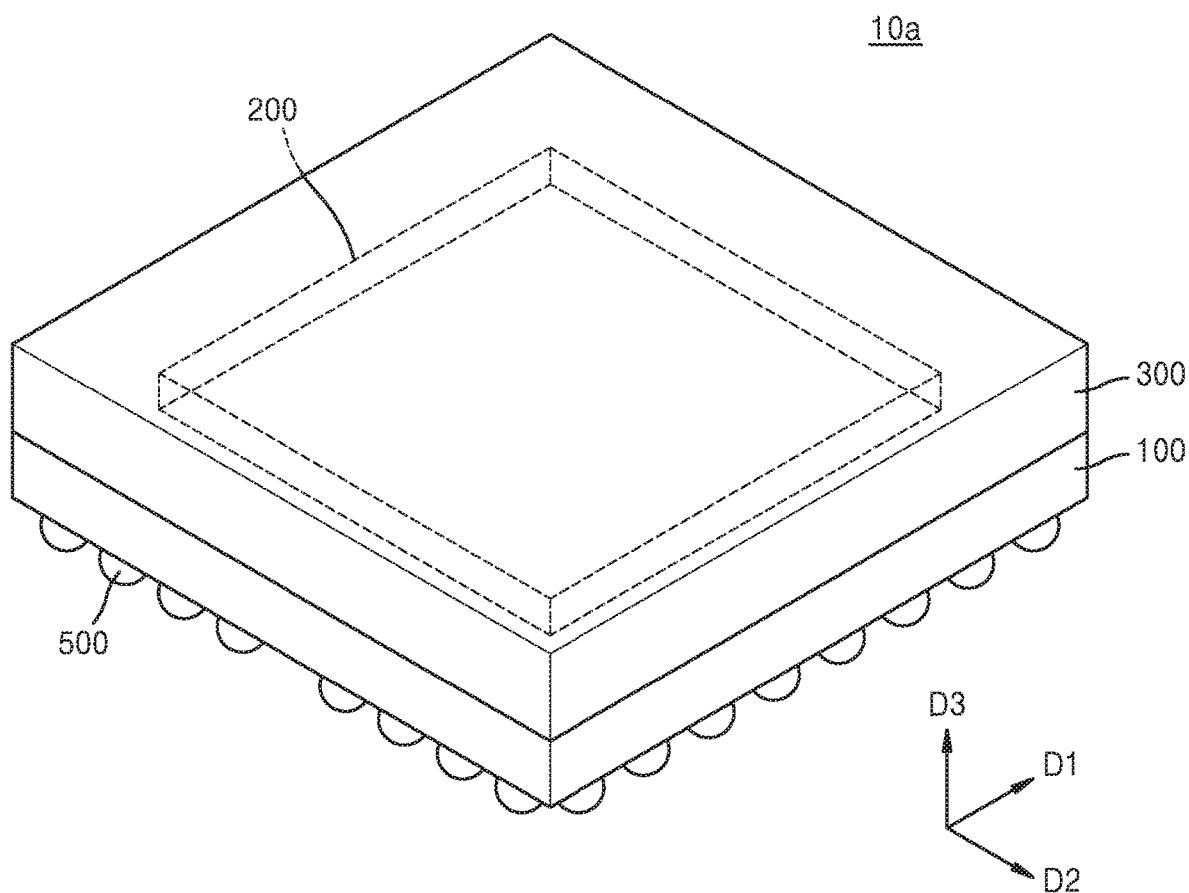
FIGS. 2A through 2E are drawings for explaining a semiconductor package according to an example embodiment.
Figure 2B:
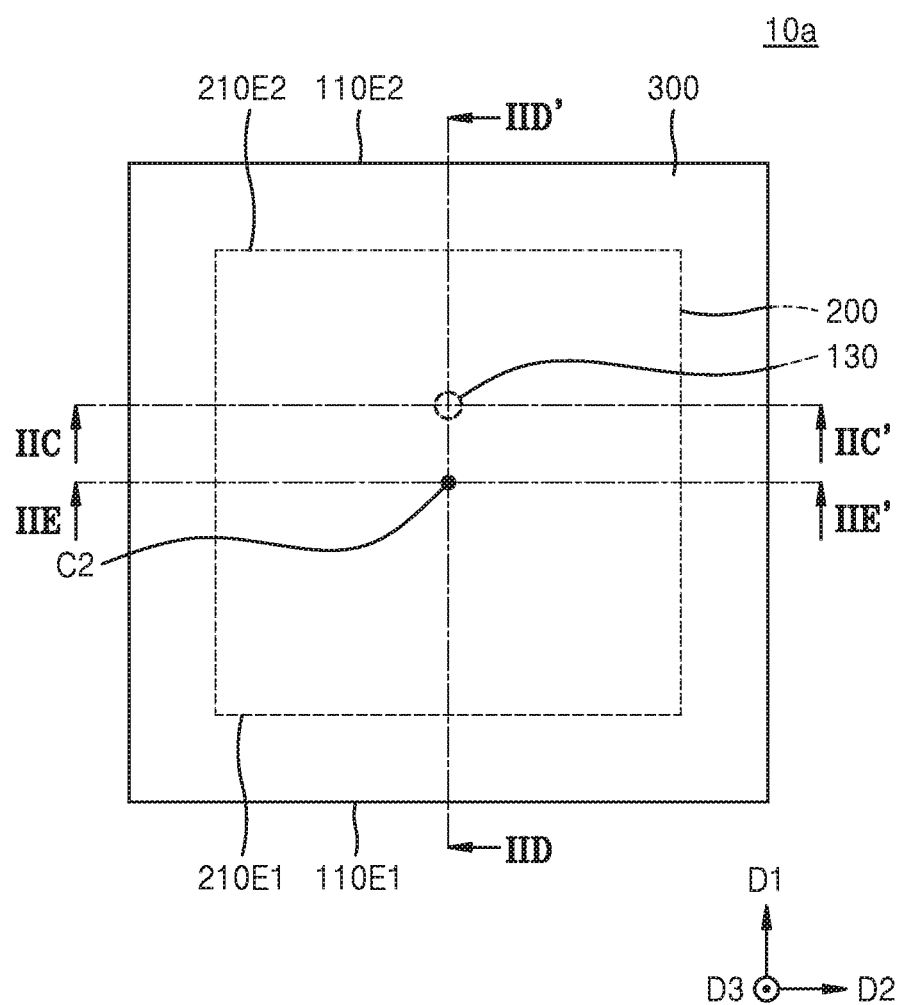
Figure 2C:
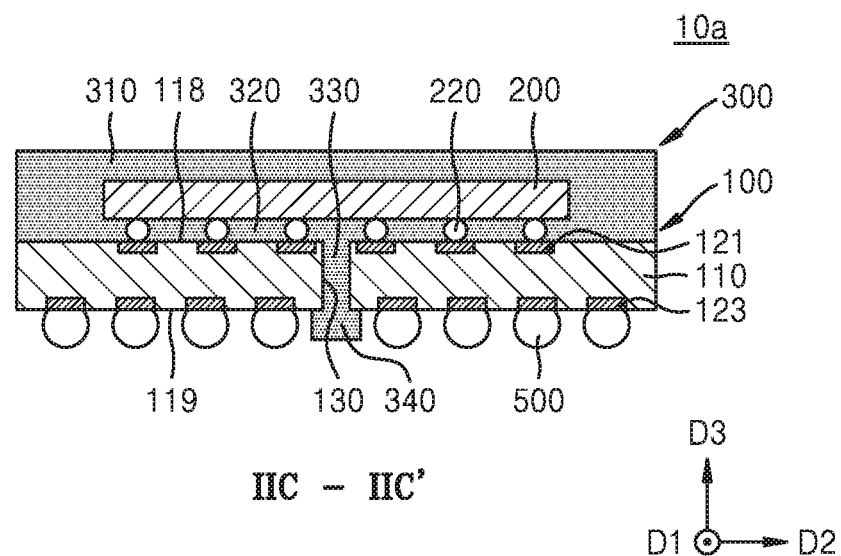
Figure 2D:
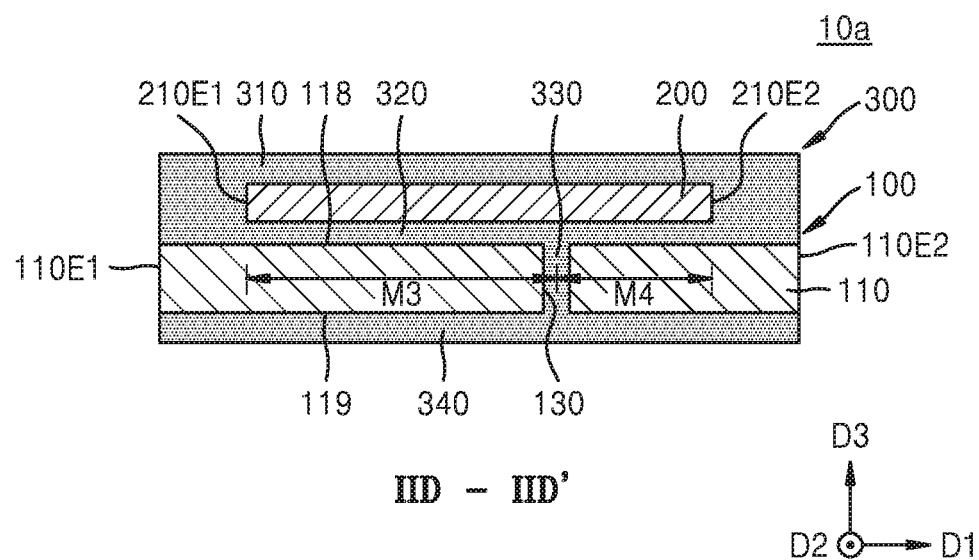
Figure 2E:
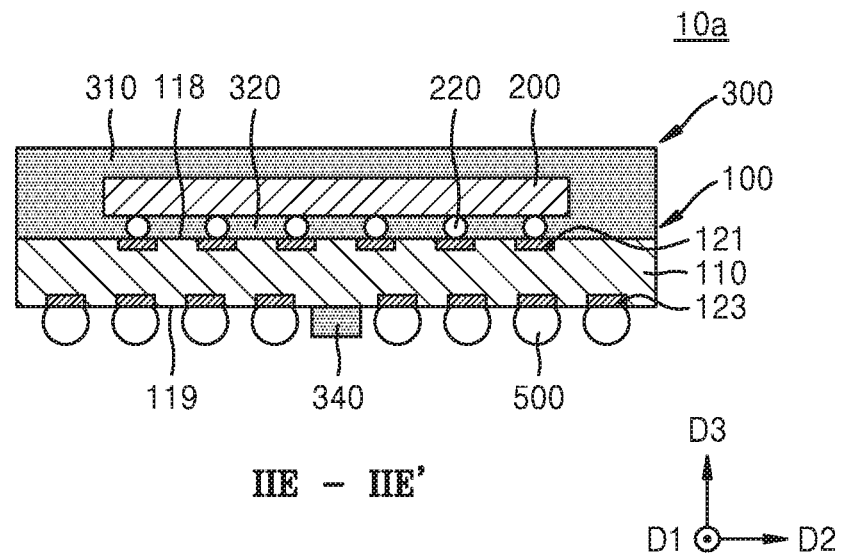

FIGS. 2A through 2E are drawings for explaining a semiconductor package 10a according to an example embodiment. FIG. 2A is a perspective view of the semiconductor package 10a, FIG. 2B is a plan view of the semiconductor package 10a, FIG. 2C is a cross-sectional view of the semiconductor package 10a taken along a line IIC-IIC' in FIG. 2B, FIG. 2D is a cross-sectional view of the semiconductor package 10a taken along a line IID-IID' in FIG. 2B, and FIG. 2E is a cross-sectional view of the semiconductor package 10a taken along a line IIE-IIE' in FIG. 2B. The semiconductor package 10a illustrated in FIGS. 2A through 2E may be the same as or substantially similar to the semiconductor package 10 illustrated in FIGS. 1A through 1D except that the semiconductor package 10a further includes a molding layer 300.

Referring to FIGS. 2A through 2E, the semiconductor package 10a may include the package substrate 100, the semiconductor chip 200 mounted on the package substrate 100, and the molding layer 300.

The molding layer 300 may include a top molding part 310 covering an outer portion of the semiconductor chip 200 and an underfill part 320 filling a space between the semiconductor chip 200 and the package substrate 100. In the example embodiment, the molding layer 300 may be formed through a molded underfill (MUF) process that molds a space between the package substrate 100 and the semiconductor chip 200 and the outer portion of the semiconductor chip 200 through a one-time molding process. The top molding part 310 and the underfill part 320 may include the same mold material. For example, the molding layer 300 may include an epoxy molding compound.

The molding layer 300 may include an extension part 330 that fills at least a portion of the through-hole 130. The extension part 330 may be connected to the underfill part 320 and penetrate the package substrate 100. The extension part 330 may completely fill the through-hole 130. However, example embodiments are not limited thereto. In some example embodiments, the extension part 330 may fill only a portion of the through-hole 130. The extension part 330 may be formed by a molding process in which a mold material having flowed between the package substrate 100 and the semiconductor chip 200 flows into the through-hole 130 during the MUF process, and the mold material having flowed into the through-hole 130 is cured.

As described above, because the through-hole 130 of the package substrate 100 is spaced apart from the center (C1 in FIG. 1A) of the mounting region (111 in FIG. 1A) and/or the center C2 of the semiconductor chip 200, the extension part 330 filling the through-hole 130 may be spaced apart by a certain distance from the center C1 of the mounting region 111 and/or the center C2 of the semiconductor chip 200.

In the embodiments, the extension part 330 may be arranged between the first side 111E1 of the mounting region 111 and the second side 111E2 of the mounting region 111, and to be closer to the second side 111E2 of the mounting region 111 than the first side 111E1 of the mounting region 111. In other words, the extension part 330 may be arranged between the first side 210E1 of the semiconductor chip 200 and the second side 210E2 of the semiconductor chip 200, and to be closer to the second side 210E2 of the semiconductor chip 200 than the first side 210E1 of the semiconductor chip 200.

In the embodiments, a third distance M3 between the extension part 330 and the first side 210E1 of the semiconductor chip 200 in the first direction D1 may be greater than a fourth distance M4 between the extension part 330 and the second side 210E2 of the semiconductor chip 200 in the first direction D1. The third distance M3 may be about 1.2 to about 4 or about 1.5 to about 3 times the fourth distance M4. In some example embodiments, the third distance M3 may be about twice the fourth distance M4.

Further, the center of the package substrate 100 may coincide with a center (C1 in FIG. 1A) of the mounting region 111 or a center (C2 in FIG. 1A) of the semiconductor chip 200, when projected or viewed in a plan view on the plane parallel to the first direction D1 and the second direction D2. In this case, the extension part 330 may be closer to the second side 110E2 of the package substrate 100 than the first side 110E1 of the package substrate 100.

The molding layer 300 may include a bottom molding part 340 provided on the second surface 119 of the package substrate 100. The bottom molding part 340 may be connected to the extension part 330 that fills the through-hole 130. The bottom molding part 340 may have a shape extending in one direction on the second surface 119 of the package substrate 100. For example, the bottom molding part 340 may extend on the second surface 119 of the package substrate 100 in the first direction D1. The bottom molding part 340 may be formed by a molding process in which a mold material having flowed through the through-hole 130 flows through a space between the second surface 119 of the package substrate 100 and a bottom mold (e.g., 620 in FIG. 7) during an MUF process, and the mold material having flowed through the space between the second surface 119 of the package substrate 100 and a bottom mold (e.g., 620 in FIG. 7) is cured.

As illustrated in FIG. 2D, the bottom molding part 340 may extend from the first side 110E1 of the package substrate 100 to the second side 110E2 of the package substrate 100 in the first direction D1. In some example embodiments, one side of the bottom molding part 340 may be apart from the first side 110E1 of the package substrate 100, or the other side of the bottom molding part 340 may be spaced apart from the second side 110E2 of the package substrate 100.

Figure 3:
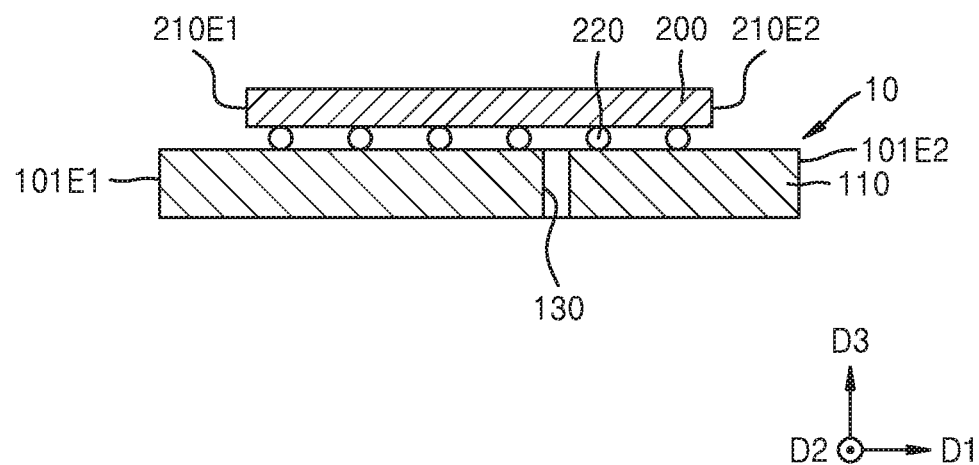
FIGS. 3 through 8 are drawings for explaining a method of manufacturing the semiconductor package illustrated in FIGS. 1A-1D, according to an example embodiment.
Figure 6:
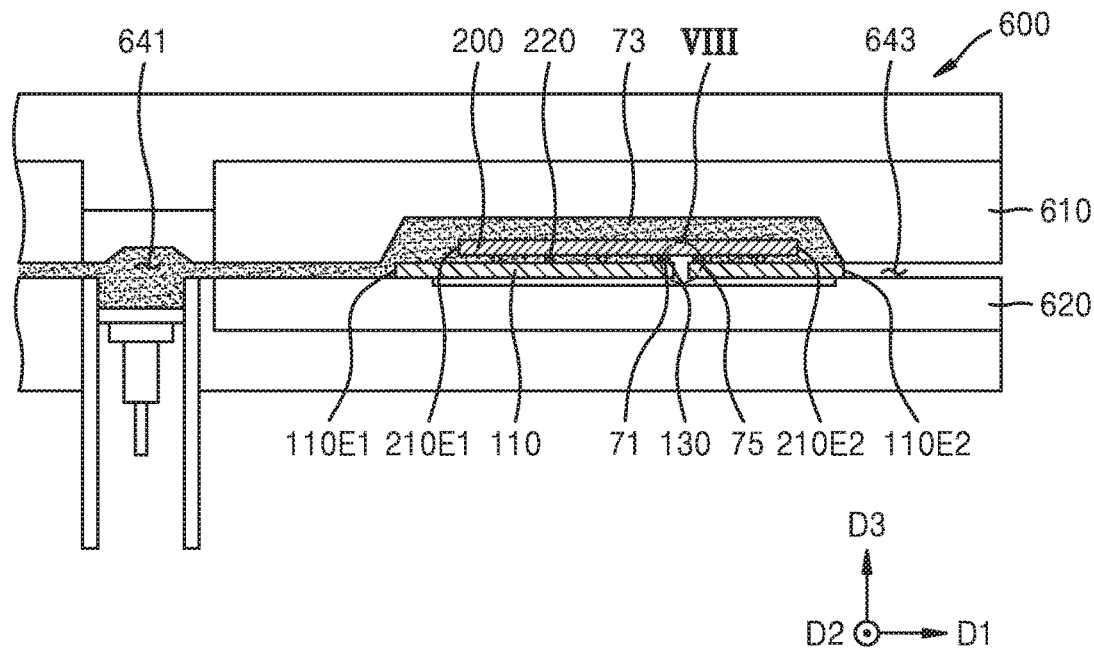
Figure 7:
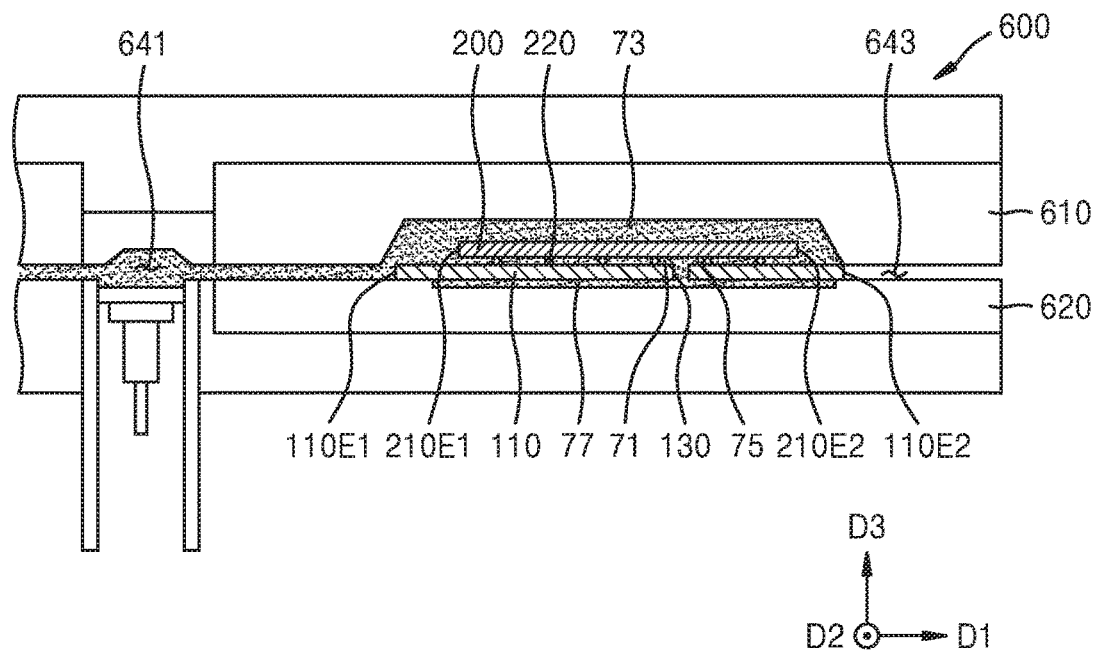
Figure 8:
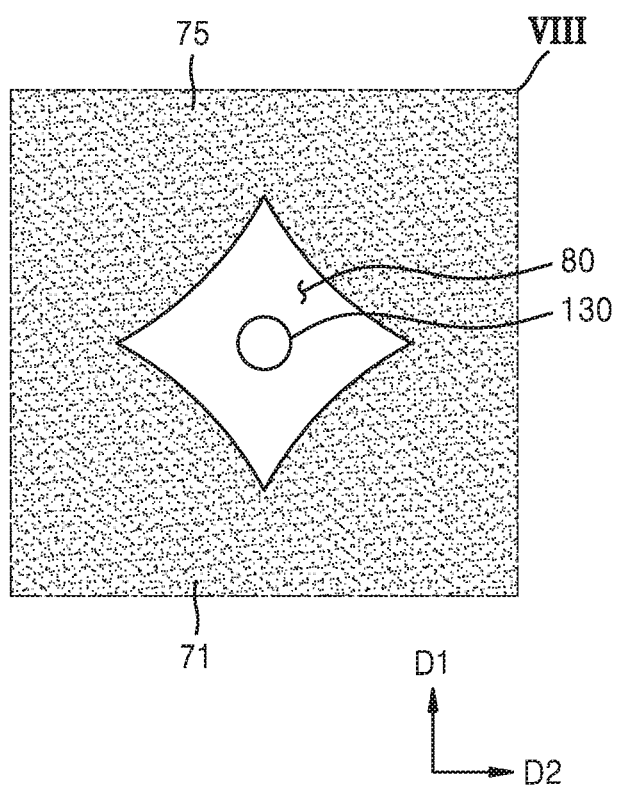

FIGS. 3 through 8 are drawings for explaining a method of manufacturing the semiconductor package 10 illustrated in FIGS. 1A-1D, according to an example embodiment. FIG. 3 is a cross-sectional view illustrating a substrate base 110 and the semiconductor chip 200 mounted thereon. FIGS. 4 through 7 are cross-sectional views illustrating a molding process using a molding device 600. FIG. 8 is a view illustrating a flow of the mold material flowing between the substrate base 110 and the semiconductor chip 200 in a region denoted as "VIII" in FIG. 6.

Referring to FIG. 3, a semiconductor chip 200 may be mounted on the substrate base 110. The semiconductor chip 200 may be mounted on a mounting region (refer to 111 in FIG. 1A) of the substrate base 110, and may be connected to the substrate base 110 via the plurality of conductive connection structures 220 (e.g., bumps). For example, the semiconductor chip 200 may be placed on the substrate base 110 such that the conductive connection structures 220 on the bottom surface of the semiconductor chip 200 are placed on corresponding ones of the top connection pads 121 of the substrate base 110, and a reflow process may be performed such that the conductive connection structures 220 are attached to the corresponding ones of the top connection pads 121.

In FIG. 2, one semiconductor chip 200 is illustrated as being mounted on the substrate base 110. However, example embodiments are not limited thereto. In some example embodiments, a plurality of semiconductor chips 200 may be mounted on the substrate base 110. In other words, the substrate base 110 may include a plurality of mounting regions for mounting the plurality of semiconductor chips 200, and the plurality of semiconductor chips 200 may be mounted on the plurality of mounting regions, respectively. In some example embodiments, the substrate base 110 may have a PCB strip structure in which a plurality of PCBs are connected to improve a process throughput in manufacturing the semiconductor package 10.

Referring to FIGS. 4 through 7, the molding device 600 may perform an MUF process to form a molding layer (e.g., 300 in FIG. 2A). The mold material 70 injected between the top mold 610 and the bottom mold 620 may include a first portion 71, a second portion 73, a third portion 75, and a fourth portion 77.

Figure 4:
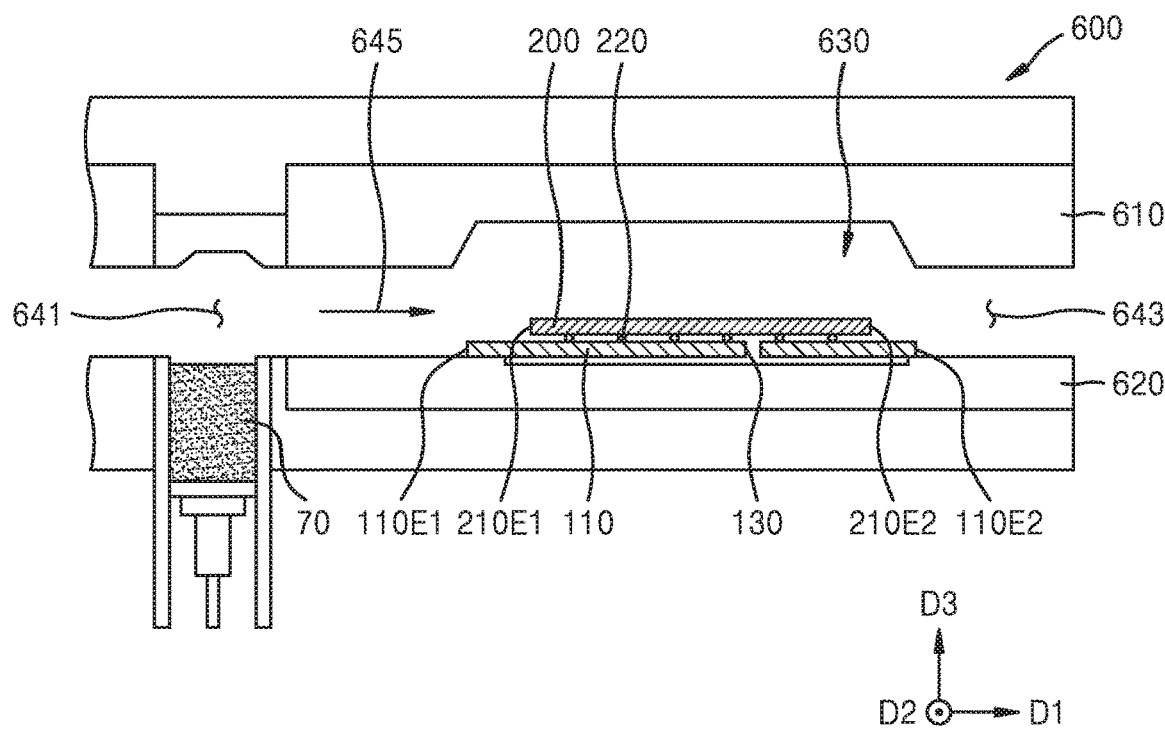

Firstly, as illustrated in FIG. 4, the substrate base 110 and the semiconductor chip 200 illustrated in FIG. 3 may be arranged in a cavity 630 between a bottom mold 620 and a top mold 610 of the molding device 600. The substrate base 110 may be fixed to the bottom mold 620 by, for example, vacuum suction or a mechanical clamping method. In this case, the first side 210E1 of the semiconductor chip 200 and the first side 101E1 of the substrate base 110 may face a gate part 641 of the molding device 600 into which a mold material 70 is injected, and the second side 210E2 of the semiconductor chip 200 and the second side 101E2 of the substrate base 110 may face a vent part 643 of the molding device 600 through which air is released.

Figure 5:
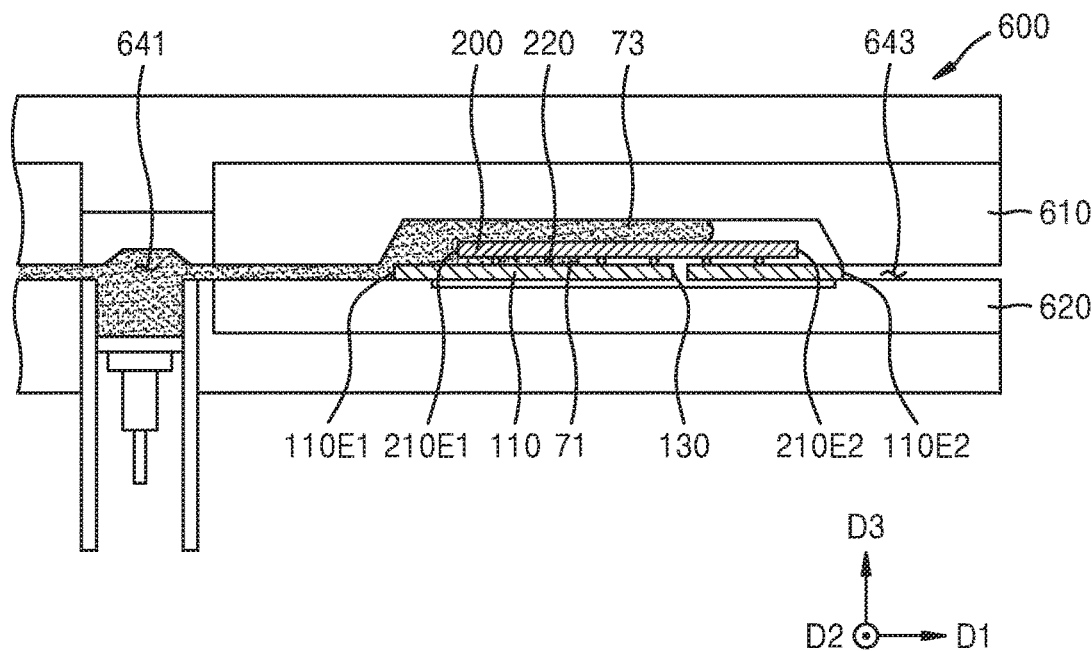

Referring to FIGS. 5 through 7, after the substrate base 110 and the semiconductor chip 200 are arranged between the bottom mold 620 and the top mold 610, the top mold 610 and the bottom mold 620 are clamped to each other, and the mold material 70 may be injected between the top mold 610 and the bottom mold 620 in an injection direction 645. For example, the mold material 70 may include an epoxy mold compound.

The mold material 70 may be injected through the gate part 641 of the molding device 600 and flow from the gate part 641 toward the vent part 643 during the molding process.

As illustrated in FIGS. 5 and 6, the mold material 70 may cover the semiconductor chip 200 and fill a space between the semiconductor chip 200 and the substrate base 110.

Referring to FIGS. 4 and 5, the mold material 70 flowing through a small gap between the semiconductor chip 200 and the substrate base 110 in the injection direction 645 forms the first portion 71. The mold material 70 flowing between a top surface of the semiconductor chip 200 and the top mold 610 in the injection direction 645 forms the second portion 73. Because a relatively large flow resistance is generated against the flow of the mold material 70 flowing through a relatively small gap between the semiconductor chip 200 and the substrate base 110 (for forming the first portion 71) moves at a slower flow rate than the mold material 70 flowing between the top surface of the semiconductor chip 200 and the top mold 610.

As illustrated in FIG. 6, after forming the second portion 73 by flowing the mold material 70 from the first side 210E1 of the semiconductor chip 200 to the second side 210E2 of the semiconductor chip 200, the mold material 70 may undergo a backflow, meaning that the mold material 70 flows in a direction opposite to the injection direction 645 between the semiconductor chip 200 and the substrate base 110. Thus, the mold material 70 may penetrates between the semiconductor chip 200 and the substrate base 110 in a direction opposite to the injection direction 645 and form the third portion 75. The backflow of the mold material 70 may fill the space between the substrate base 110 and the semiconductor chip 200 together with the forward flow of the mold material 70

In general, a flow rate of the forward flow of the mold material 70 and a flow rate of the backflow of the mold material 70 may be different from each other, thereby causing defects (e.g., a void) between the substrate base 110 and the semiconductor chip 200. Because the backflow of the mold material 70 flows in a direction opposite to the injection direction 645 before the forward flow of the mold material 70 fills an entire space between the substrate base 110 and the semiconductor chip 200, an air trap 80 including air surrounded by the first portion 71 and the third portion 75 may be generated between the first portion 71 formed by the forward flow and the third portion 75 formed by the backflow. When the air trap 80 is not released (or not cured) during the molding process, the unreleased air trap 80 may remain between the substrate base 110 and the semiconductor chip 200 inside the molding device 600, thereby causing, for example, a void defect. According to some example embodiments of the inventive concepts, however, because the through-hole 130 included in the package substrate 100 helps release air between the substrate base 110 and the semiconductor chip 200 during the molding process, an occurrence of a void defect between the semiconductor chip 200 and the substrate base 110 may be mitigated or prevented.

Referring to FIG. 7, the mold material 70 flows between the bottom surface 119 of the substrate base 110 and the bottom mold 620 through the through-hole 130 and forms the fourth portion 77 covering at least a portion of the bottom surface 119 of the substrate base 110.

Further, as illustrated in FIGS. 6 and 8, the air trap 80 surrounded by the first portion 71 and the third portion 75 may be formed between the center C2 of the semiconductor chip 200 and the second side 210E2 of the semiconductor chip 200. As a size of the semiconductor chip 200 increases, the first width W1 of the semiconductor chip 200 in the injection direction 645 of the molding material 70 may increase, thereby causing the air trap 80 to be formed at a position farther from the center C2 of the semiconductor chip 200. In the case that the through-hole 130 is formed at the center C2 of the semiconductor chip 200 or formed between the center C2 of the semiconductor chip 200 and the first side 210E1 of the semiconductor chip 200, air may not be released and remain inside the molding layer filling the space between the substrate base 110 and the semiconductor chip 200, thereby causing, for example, a void defect. According to the illustrated example embodiment, however, the through-hole 130 is formed at the position where the air trap 80 is generated (e.g., a position between the center C2 of the semiconductor chip 200 and the second side 210E2 of the semiconductor chip 200), and thus the air trapped between the first portion 71 and the third portion 75 of the mold material 70 may be released through the through-hole 130. Thus, an occurrence of a void defect between the semiconductor chip 200 and the substrate base 110 may be mitigated or prevented.

Further, in the case that a through-hole 130 penetrating the substrate base 110 is formed at the center C2 of the semiconductor chip 200 or between the center C2 of the semiconductor chip 200 and the first side 210E1 of the semiconductor chip 200, the flow rate of the mold material 70 in the vicinity of the hole may be reduced as a portion of the mold material 70 flows through the hole, the flow rate of the mold material 70 in the vicinity of the hole may become unbalanced. According to the embodiments of the inventive concepts, however, the through-hole 130 is formed only between the center C2 of the semiconductor chip 200 and the second side 210E2 of the semiconductor chip 200. Thus, the difference in flow rates between the forward flow and the backflow of the mold material 70 between the substrate base 110 and the semiconductor chip 200 may be reduced or removed.

FIGS. 9A through 16B are drawings for explaining through-holes 130a, 130b, 130c, 130d, 130e, 130f, 130g, and 130h of package substrates according to some example embodiments. Descriptions of FIGS. 9A through 16B may be substantially the same as or substantially similar to those of the semiconductor package 10 illustrated in FIGS. 1A through 1D or those of the semiconductor package 10a illustrated in FIGS. 2A through 2E, except for the number and/or structure of the through-holes 130a, 130b, 130c, 130d, 130e, 130f, 130g, and 130h.

Figure 9A:
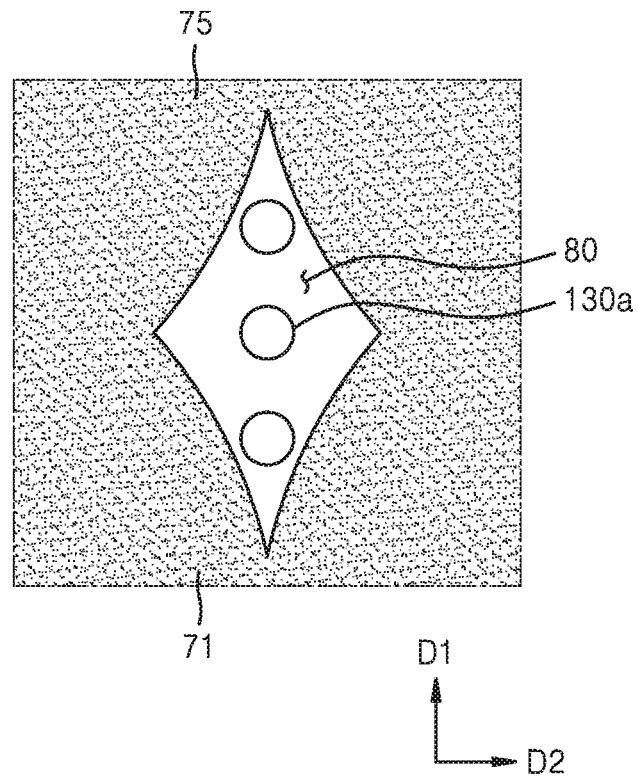
FIGS. 9A through 16B are drawings for explaining through-holes of package substrates according to some example embodiments.
Figure 9B:
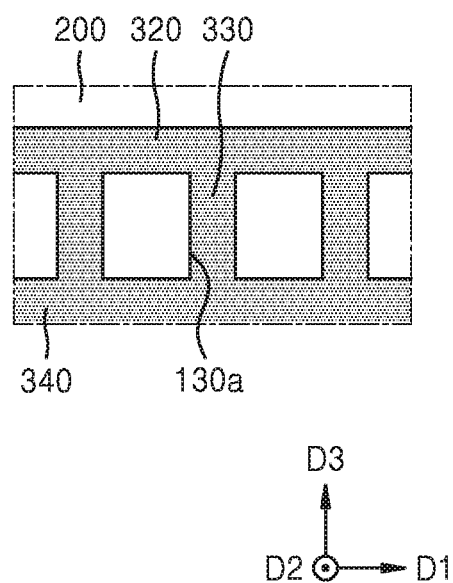

Referring to FIGS. 9A and 9B, and FIG. 1A, the package substrate 100 may include a plurality of through-holes 130a between the center C1 of the mounting region 111 and the second side 210E2 of the semiconductor chip 200.

The plurality of through-holes 130a may be arranged between the center C1 of the mounting region 111 and the second side 111E2 of the mounting region 111 and may be spaced apart from each other in the first direction D1. Although three through-holes 130a are illustrated as being formed in the package substrate 100 in FIG. 9, example embodiments of the inventive concepts are not limited thereto. According to some example embodiments, two or more than four through-holes 130a may be formed in the package substrate 100.

For example, when the first width W1 of the semiconductor chip 200 in the first direction D1 is greater than the second width W2 of the semiconductor chip 200 in the second direction D2, the air trap 80 between the semiconductor chip 200 and the package substrate 100 may be formed to have an elongated shape in the first direction D1. Here, by arranging the plurality of through-holes 130a in the first direction D1 to correspond to a shape of the air trap 80, air may be more effectively released through the plurality of through-holes 130a during the molding process.

In this case, the molding layer 300 as shown in FIG. 2D may include a plurality of extension parts 330 that fill the plurality of through-holes 130a, and are spaced apart from each other in the first direction D1.

Figure 10A:
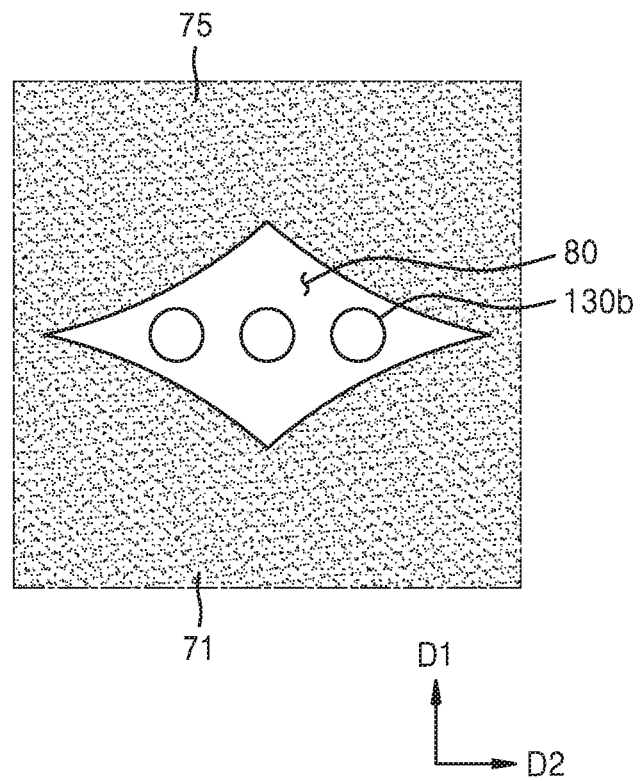
Figure 10B:
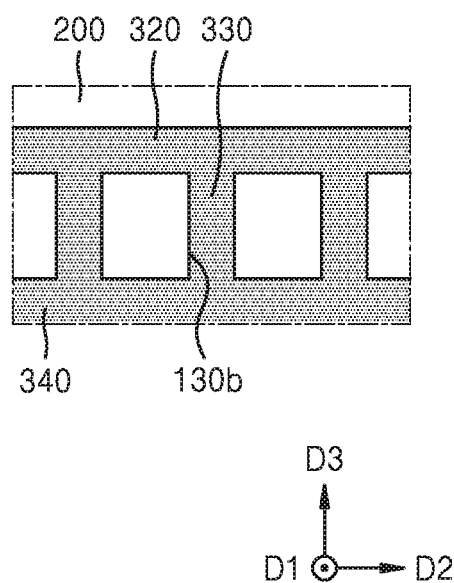

Referring to FIGS. 10A and 10B, and FIG. 1A, the package substrate 100 may include a plurality of through-holes 130b that are arranged between the center C1 of the mounting region 111 and the second side 111E2 of the mounting region 111 in a second direction D2.

For example, when the second width W2 of the semiconductor chip 200 is greater than the first width W1 of the semiconductor chip 200, the air trap 80 between the semiconductor chip 200 and the package substrate 100 may be formed to have an elongated shape in the second direction D2. Here, by arranging the plurality of through-holes 130b in the first direction D1 to correspond to a shape of the air trap 80, air may be more effectively released through the plurality of through-holes 130b.

In this case, the molding layer 300 as shown in FIG. 2D may include a plurality of extension parts 330 that fill the plurality of through-holes 130b, and are spaced apart from each other in the second direction D2.

Figure 11:
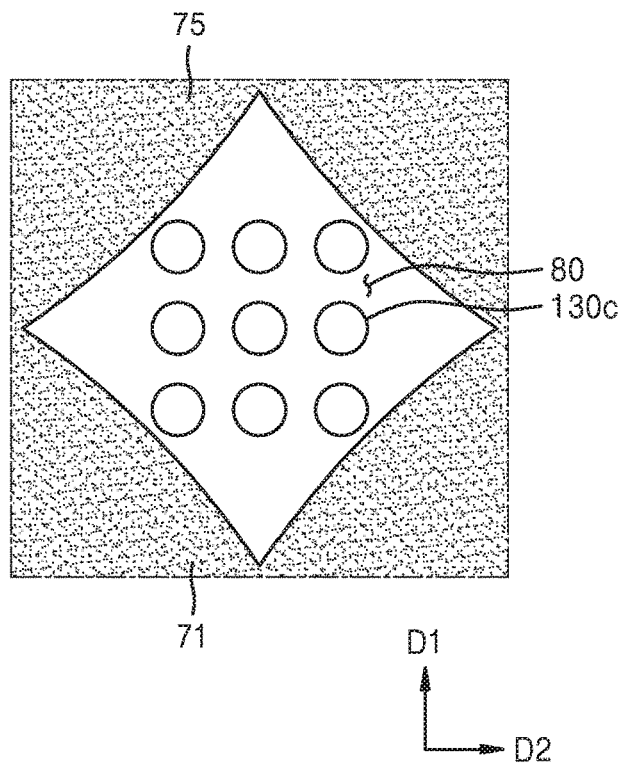

Referring to FIG. 11 and FIG. 1A, the package substrate 100 may include a plurality of through-holes 130c that are arranged between the center C1 of the mounting region 111 and the second side 111E2 of the mounting region 111 in a two-dimensional array. In other words, the plurality of through-holes 130c may be arranged in the first direction D1 and the second direction D2.

In this case, the molding layer 300 as shown in FIG. 2D may include a plurality of extension parts 330 filling the plurality of through-holes 130c, and arranged in a two-dimensional array.

Figure 12:
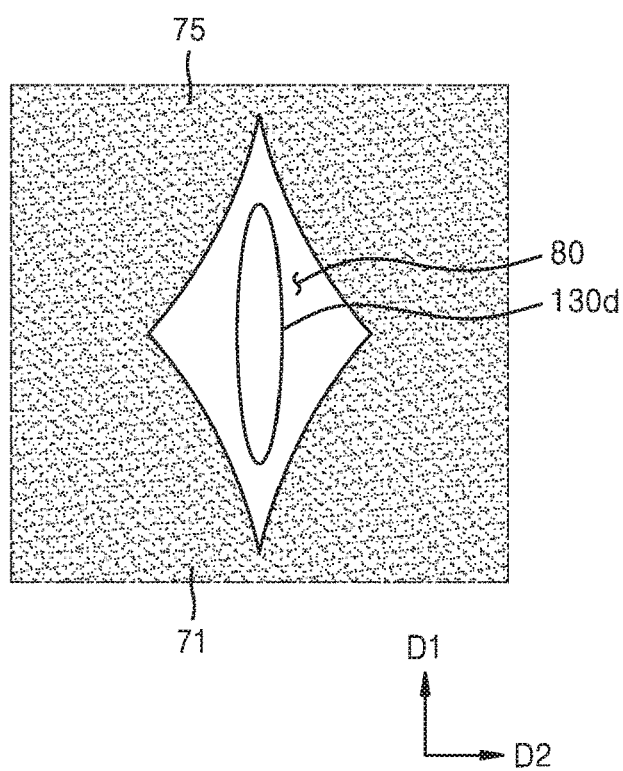

Referring to FIG. 12 and FIG. 1A, a through-hole 130d may be arranged between the center C1 of the mounting region 111 and the second side 111E2 of the mounting region 111 in the first direction D1. For example, a horizontal cross-section of the through-hole 130d may have a line shape extending in the first direction D1, or an oval shape having a longer axis, from among two axes of symmetry, in the first direction D1.

In this case, the extension part 330 of the molding layer 300 as shown in FIG. 2D may have a shape corresponding to a shape of the through-hole 130d. For example, a horizontal cross-section of the extension part 330 may have a line shape extending in the first direction D1, or an oval shape having a longer axis, from among two axes of symmetry, in the first direction D1.

Figure 13:
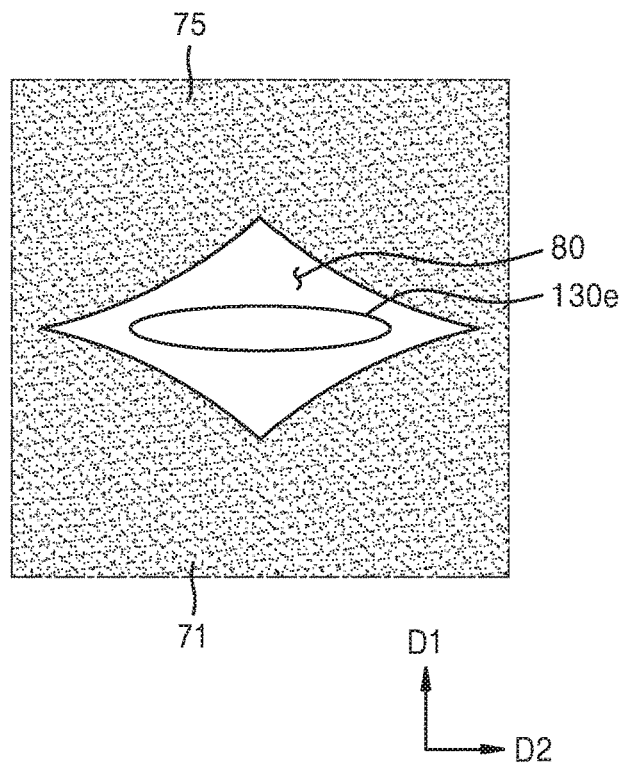

Referring to FIG. 13 and FIG. 1A, a through-hole 130e may be arranged between the center C1 of the mounting region 111 and the second side 111E2 of the mounting region 111 in the second direction D2. For example, a horizontal cross-section of the through-hole 130e may have a line shape extending in the first direction D2, or an oval shape having a long axis, from among two axes of symmetry, in the first direction D2.

In this case, the extension part 330 of the molding layer 300 as shown in FIG. 2D may have a shape corresponding to a shape of the through-hole 130e. For example, a horizontal cross-section of the extension part 330 may have a line shape extending in the second direction D2, or an oval shape having a long axis, from among two axes of symmetry, in the second direction D2.

Figure 14:
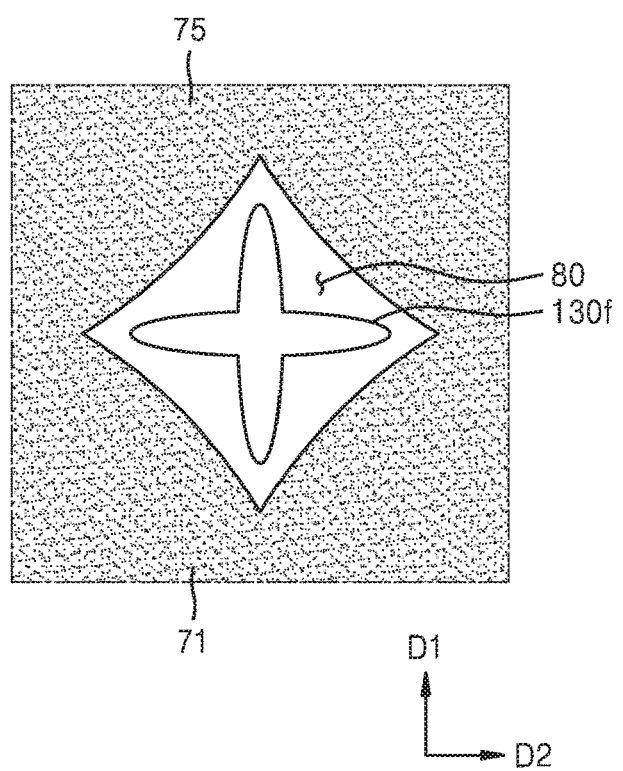

Referring to FIG. 14 and FIG. 1A, a through-hole 130f may be arranged between the center C1 of the mounting region 111 and the second side 111E2 of the mounting region 111, and may extend in the first direction D1 and the second direction D2. For example, the through-hole 130f may have a first portion of a line shape extending in the first direction D1, and a second portion of a line shape extending in the second direction D2. In this case, the first portion of the through-hole 130f and the second portion of the through-hole 130f may intersect with each other.

In this case, the extension part 330 of the molding layer 300 as shown in FIG. 2D may have a shape corresponding to a shape of the through-hole 130e. For example, the horizontal cross-section of the extension part 330 may have a line shape extending in the first direction D1 and a line shape extending in the second directions D2.

Figure 15A:
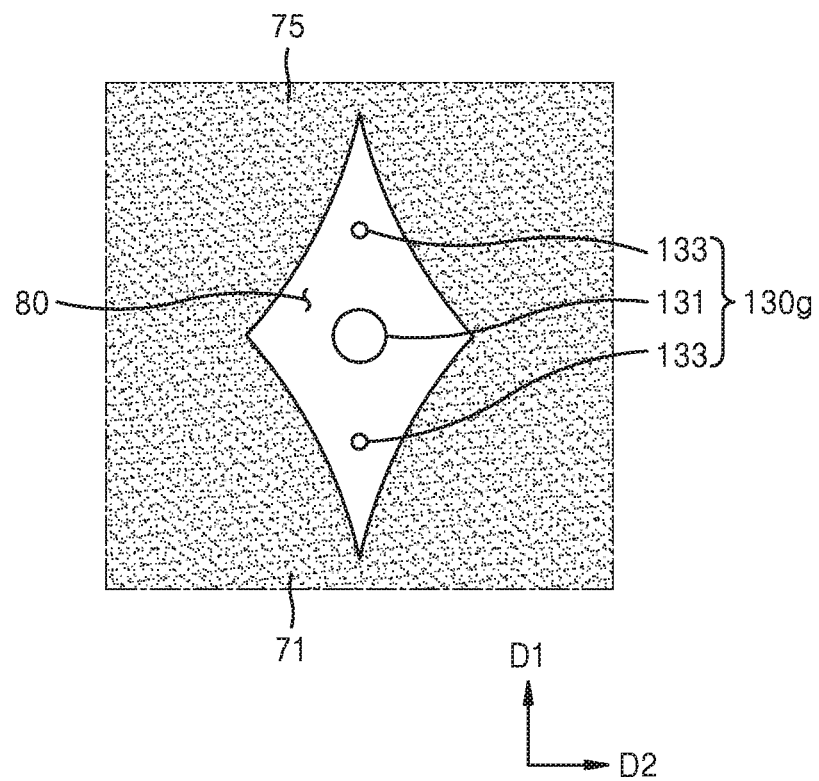
Figure 15B:
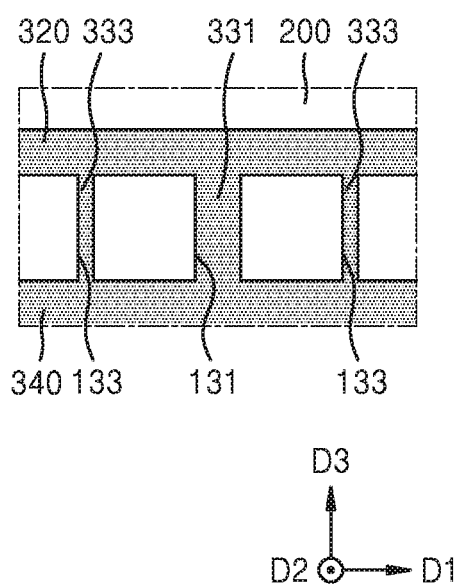

Referring to FIGS. 15A and 15B, and FIG. 1A, the package substrate 100 may include a set of through-holes 130g arranged between the center C1 of the mounting region 111 and the second side 111E2 of the mounting region 111. The set of through-holes 130g may include a first through-hole 131 and one or more second through-holes 133. The one or more second through-holes 133 may enable an auxiliary release of air in the molding process, and may have a smaller size than the first through-hole 131. For example, a horizontal cross-sectional area of the first through-hole 131 may be greater than that of each of the one or more second through-holes 133.

In the example embodiment, the first through-hole 131 and the one or more second through-holes 133 may be arranged in the first direction D1. For example, the one or more second through-holes 133 may include two second through-holes 133, and the first through-hole 131 may be arranged between the two second through-holes 133 in the first direction D1.

In this case, the molding layer 300 as shown in FIG. 2D may include a first extension part 331 filling the first through-hole 131 and one or more second extension parts 333 filling the one or more second through-holes 133. Here, a horizontal cross-sectional area of the first extension part 331 may be greater than that of each of the one or more second extension parts 333. For example, the one or more second extension parts 333 may include two second extension parts 333, and the first extension part 331 and the two second extension parts 333 may be spaced apart from each other in the first direction D1, and the first extension part 331 may be arranged between the two second extension parts 333.

Figure 16A:
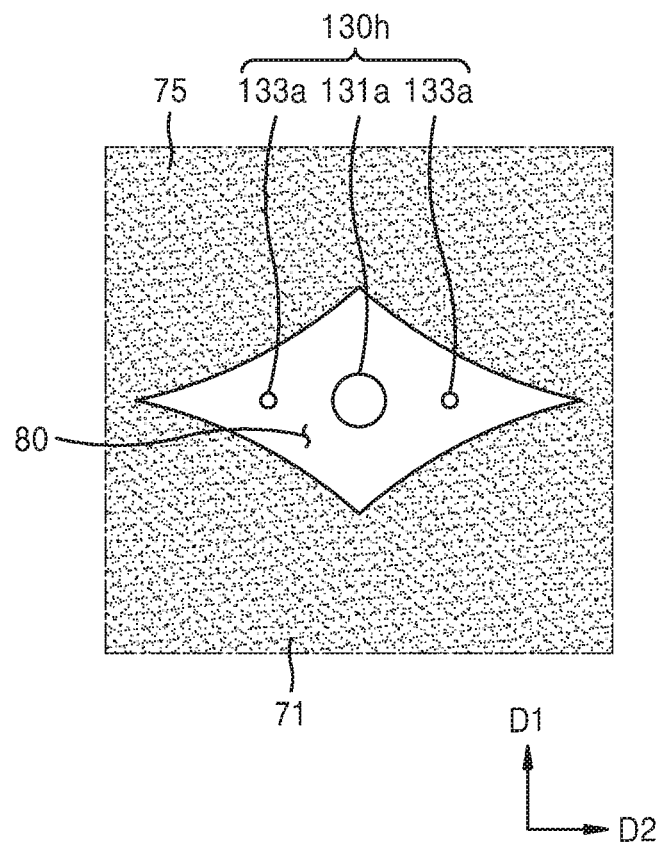
Figure 16B:
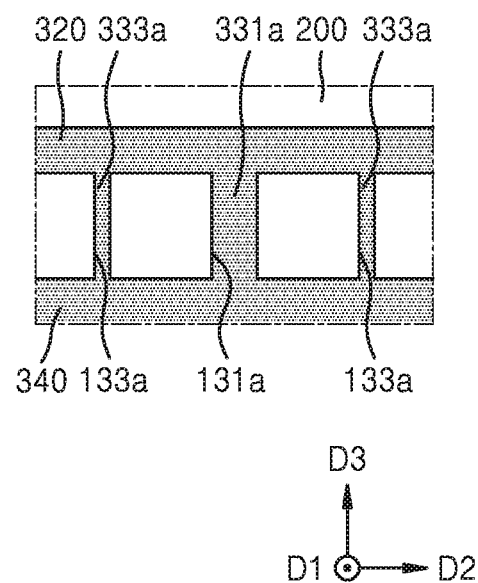

Referring to FIGS. 16A and 16B, and FIG. 1A, the package substrate 100 may include a set of through-holes 130h arranged between the center C1 of the mounting region 111 and the second side 111E2 of the mounting region 111. The set of through-holes 130h may include a first through-hole 131a and one or more second through-holes 133a having a smaller size than the first through-hole 131a.

In the example embodiment, the first through-hole 131a and the one or more second through-hole 133a may be arranged in the second direction D2. For example, the one or more second through-holes 133a may include two second through-holes 133a, and the first through-hole 131a may be arranged between the two second through-holes 133a in the second direction D2.

In this case, the molding layer 300 in FIG. 2D may include a first extension part 331a filling the first through-hole 131a and one or more second extension parts 333a filling the one or more second through-holes 133a. Here, a horizontal cross-sectional area of the first extension part 331a may be greater than that of each of the one or more second extension parts 333a. For example, the one or more second extension parts 333a may include two second extension parts 333a, and the first extension part 331a and the two second extension parts 333a may be spaced apart from each other in the second direction D2, and the first extension part 331a may be arranged between the two second extension parts 333a.

As described above, some example embodiments have been disclosed in the drawings and the specification. While the example embodiments have been described herein with reference to specific terms, it should be understood that they have been used only for the purpose of describing some technical aspects of the inventive concepts and not for limiting the scope of the inventive concepts. Therefore, one with ordinary skill in the art will appreciate that various modifications and variations of the example embodiments are possible without departing from the scope of the inventive concepts. Accordingly, the scope of the inventive concepts should be defined by the following claims and their equivalents.

What is claimed is:

1. A semiconductor package comprising:
   a package substrate including a mounting region and at least one through-hole arranged in the mounting region;
   a semiconductor chip mounted on the mounting region, the semiconductor chip including a first lateral side and a second lateral side, the second lateral side of the semiconductor chip being opposite to the first lateral side of the semiconductor chip, the second lateral side of the semiconductor chip being closer to the at least one through-hole of the package substrate than the first lateral side of the semiconductor chip; and
   a non-conductive molding layer including an underfill part and an extension part, the underfill part between the semiconductor chip and the package substrate, the extension part filling at least a portion of the at least one through-hole.

2. The semiconductor package of claim 1, wherein a first distance between the at least one through-hole and the first lateral side of the semiconductor chip is about 1.5 to 3 times a second distance between the at least one through-hole and the second lateral side of the semiconductor chip.

3. The semiconductor package of claim 1, wherein the at least one through-hole comprises a plurality of through-holes.

4. The semiconductor package of claim 3, wherein the plurality of through-holes are arranged in a first direction perpendicular to the first lateral side of the semiconductor chip or in a second direction parallel to the first lateral side of the semiconductor chip.

5. The semiconductor package of claim 3, wherein the plurality of through-holes comprise a first through-hole and one or more second through-holes, which have a size smaller than the first through-hole.

6. The semiconductor package of claim 5, wherein
   the one or more second through-holes include two second through-holes, and
   the first through-hole is between the two second through-holes in a first direction perpendicular to the first lateral side of the semiconductor chip or in a second direction parallel to the first lateral side of the semiconductor chip.

7. The semiconductor package of claim 3, wherein the plurality of through-holes are arranged in a two-dimensional array in a first direction perpendicular to the first lateral side of the semiconductor chip and a second direction parallel to the first lateral side of the semiconductor chip.

8. The semiconductor package of claim 1, wherein the at least one through-hole has a line shape extending in a first direction perpendicular to the first lateral side of the semiconductor chip or in a second direction parallel to the first lateral side of the semiconductor chip.

9. A semiconductor package comprising:
   a package substrate;
   a semiconductor chip mounted on the package substrate, the semiconductor chip including a first lateral side and a second lateral side opposite to the first lateral side; and
   a non-conductive molding layer including an underfill part between the semiconductor chip and a first surface of the package substrate, and at least one extension part penetrating the package substrate, the extension part being between the first lateral side of the semiconductor chip and the second lateral side of the semiconductor chip, the extension part being closer to the second lateral side of the semiconductor chip than the first lateral side of the semiconductor chip.

10. The semiconductor package of claim 9, wherein the non-conductive molding layer further comprises a bottom molding part on a second surface of the package substrate and connected to the at least one extension part, the second surface of the package substrate being opposite to the first surface of the package substrate.

11. The semiconductor package of claim 9, wherein the extension part comprises a plurality of extension parts apart from each other in a first direction perpendicular to the first lateral side of the semiconductor chip.

12. The semiconductor package of claim 9, wherein the at least one extension part comprises a plurality of extension parts, which are spaced apart from each other in a first direction parallel to the first lateral side of the semiconductor chip.

13. The semiconductor package of claim 9, further comprising:
   a plurality of bumps between the semiconductor chip and the package substrate and providing electrical connection therebetween, the plurality of bumps being surrounded by the underfill part.

14. The semiconductor package of claim 9, wherein the extension part has a horizontal cross-section in a line shape.

15. A printed circuit board for a molded underfill process in which a mold material is injected in one direction, the printed circuit board comprising:
a substrate base including a first side and a second side opposite to the first side, the first side of the substrate base being a side into which a mold material is injected; and
at least one through-hole penetrating the substrate base, the at least one through-hole configured to receive the mold material therethrough, the at least one through-hole being closer to the second side of the substrate base than to the first side of the substrate base.

16. The printed circuit board of claim 15, wherein the substrate base comprises a mounting region and the at least one through-hole arranged in the mounting region, the mounting region being a region in which a semiconductor chip is mounted.

17. The printed circuit board of claim 16, wherein
the mounting region comprises a first side and a second side, which are opposite to each other, the first side of the mounting region being adjacent the first side of the substrate base, and
the at least one through-hole is between a center of the mounting region and the second side of the mounting region.

18. The printed circuit board of claim 15, wherein the at least one through-hole comprises a plurality of through-holes.

19. The printed circuit board of claim 18, wherein the plurality of through-holes are spaced apart from each other in an injection direction of the mold material.

* * * * *